US007043382B2

(12) United States Patent
Heo (10) Patent No.: US 7,043,382 B2
(45) Date of Patent: May 9, 2006

(54) LOW VOLTAGE SWING BUS ANALYSIS METHOD USING STATIC TIMING ANALYSIS TOOL

(75) Inventor: Yun Heo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 73 days.

(21) Appl. No.: 10/778,125

(22) Filed: Feb. 17, 2004

(65) Prior Publication Data

US 2004/0163066 A1  Aug. 19, 2004

(30) Foreign Application Priority Data

Feb. 18, 2003  (KR) ............... 10-2003-0010054

(51) Int. Cl.
*G06F 9/45* (2006.01)

(52) U.S. Cl. ............... 702/64; 716/6; 716/12; 716/17; 716/18; 713/500; 713/400

(58) Field of Classification Search ............... 702/64; 716/6, 12, 17, 18; 713/500, 400; 710/104
See application file for complete search history.

(56) References Cited

U.S. PATENT DOCUMENTS

| 4,744,084 A  * | 5/1988  | Beck et al. .................. 714/33 |
| 4,924,430 A    | 5/1990  | Zasio et al. |
| 6,643,787 B1 * | 11/2003 | Zerbe et al. ................ 713/400 |
| 2004/0076192 A1* | 4/2004 | Zerbe et al. ................ 370/516 |

FOREIGN PATENT DOCUMENTS

JP        11168120        6/1999

* cited by examiner

*Primary Examiner*—John Barlow
*Assistant Examiner*—Hien Vo
(74) *Attorney, Agent, or Firm*—Harness, Dickey Y Pierce, PLC (57) ABSTRACT

A low voltage swing bus analysis method using a static timing analysis (STA) tool, which provides simple and accurate timing analysis verification. The low voltage swing bus analysis method is used in a static timing analysis (STA) tool. The STA tool receives a design file which executes the timing verification program then extracts the timing model for each cell, present in a design file during execution of the timing verification program, and calculates a timing for each node. The STA tool extracts a timing model for a sense amplifying flip flop, among cells present in the design file during execution of the timing verification program, from execution of a subroutine and calculating a timing for each node connected to the sense amplifying flip flop. The STA tool outputs the calculated timings.

16 Claims, 6 Drawing Sheets

| VOLTAGE DIFFERENCE | SACLK SLOPE | OUTPUT LOAD | SACLK TO QH DELAY |
|---|---|---|---|
| 1.1V | 70ps | 50fF | 100ps |
| 1.0V | 70ps | 50fF | 102ps |
| ⋮ | ⋮ | ⋮ | ⋮ |
| 0.2V | 70ps | 50fF | 110ps |
| 0.1V | 70ps | 50fF | 112ps |
| ⋮ | ⋮ | ⋮ | ⋮ |

INCREASE BY m%

| SACLK<br>-INH | INH<br>SLOPE | SACLK<br>SLOPE | SACLK TO<br>QH DELAY |
|---|---|---|---|
| INFINITE | 200ps | 70ps | 100ps |
| ⋮ | ⋮ | ⋮ | ⋮ |
| -30ps | 200ps | 70ps | 110ps |
| -35ps | 200ps | 70ps | 115ps |
| ⋮ | ⋮ | ⋮ | ⋮ |

INCREASE BY m%

FIG. 8

LOW VOLTAGE SWING BUS ANALYSIS METHOD USING STATIC TIMING ANALYSIS TOOL

CROSS REFERENCE TO RELATED APPLICATION

This application claims the priority of Korean Patent Application No. 2003-10054, filed on 18 Feb. 2003, in the Korean Intellectual Property Office, the disclosure of which is hereby incorporated by reference in its entirety.

BACKGROUND OF THE INVENTION

1. Field of the Invention

The present invention relates to an analysis method used in a static timing analysis (STA) tool, and more particularly, to a timing analysis method for a semiconductor circuit or logic circuit having a low-voltage swing bus.

2. Description of the Related Art

Semiconductor memory devices such as dynamic random access memories (DRAMs) or application-specific integrated circuits (ASIC) are released into the market after a design process, manufacturing, and semiconductor chip testing or a test for semiconductor packages. During the design process, static timing analysis (hereinafter, STA) is performed by analyzing the timings of signals input to or output from the designed circuit, to ensure that the designed circuit works properly. An STA tool performs STA when it receives the designed circuit. During STA, delay models for cells included in the designed circuit are extracted from a database. The database stores delay models for cells, including transistor level cells, gate level cells, unit logic (AND, OR, and the like) level cells, or other cells, such as a sense amplifying flip-flop, in which it is difficult to calculate delays. Next, the timings for input and/or output signals of each cell are analyzed. After that, delays between nodes of the designed circuit are reported to a user. U.S. Pat. No. 4,924,430 discloses such an STA.

During a high-performance design process, a low voltage swing bus is generally used to interface with the semiconductor or logic circuit. The semiconductor or logic unit benefits from the speed and power consumption of the low voltage swing bus.

The low voltage swing bus is a signal interface line, which is designed not to experience a full supply voltage VDD swing in the semiconductor circuit or logic circuit, but rather experience the full supply voltage VDD swing in response to a voltage that is less than the supply voltage VDD after a receiving end senses a signal fed from a transmitting end.

Figure 1:
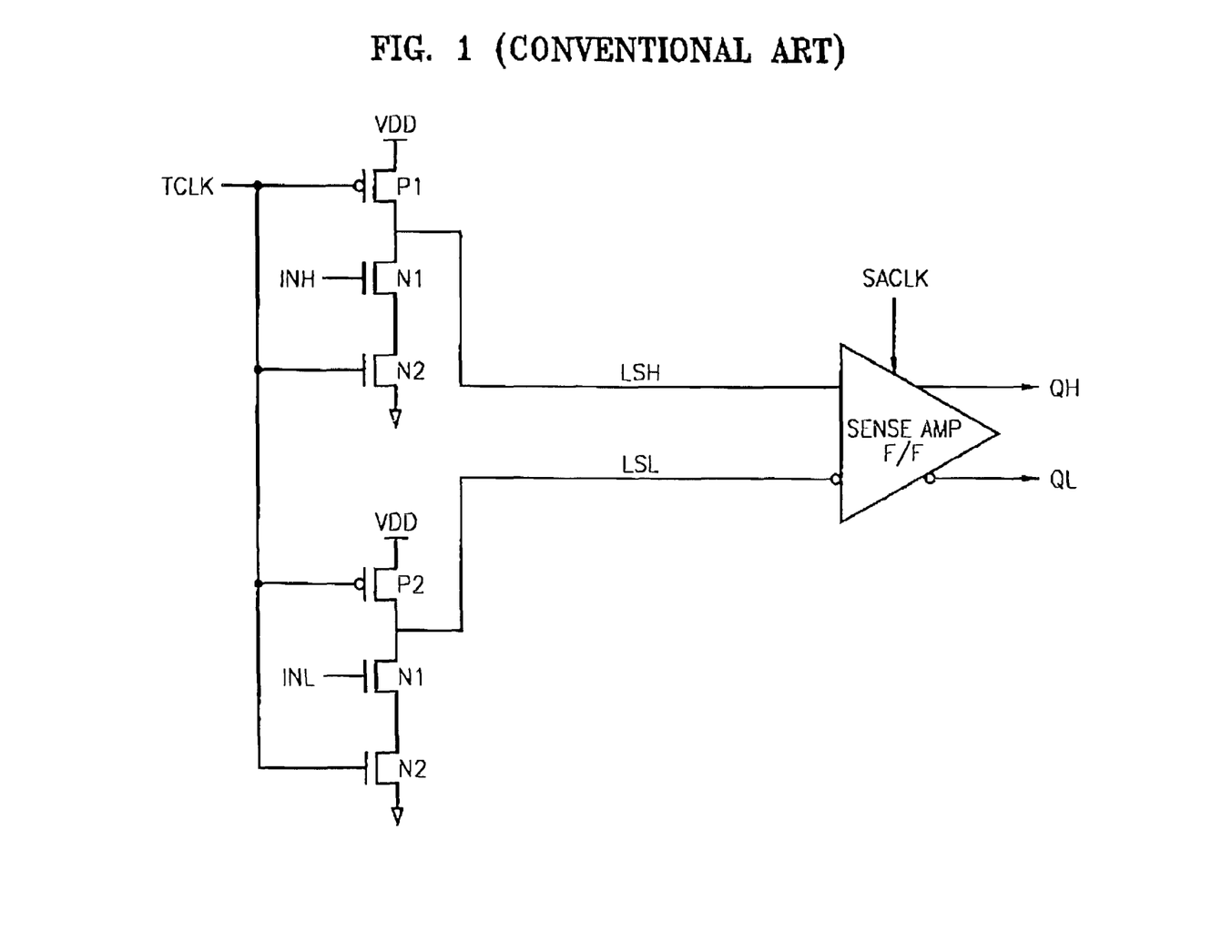
FIG. 1 is a block diagram illustrating a background low voltage swing bus.
Figure 2:
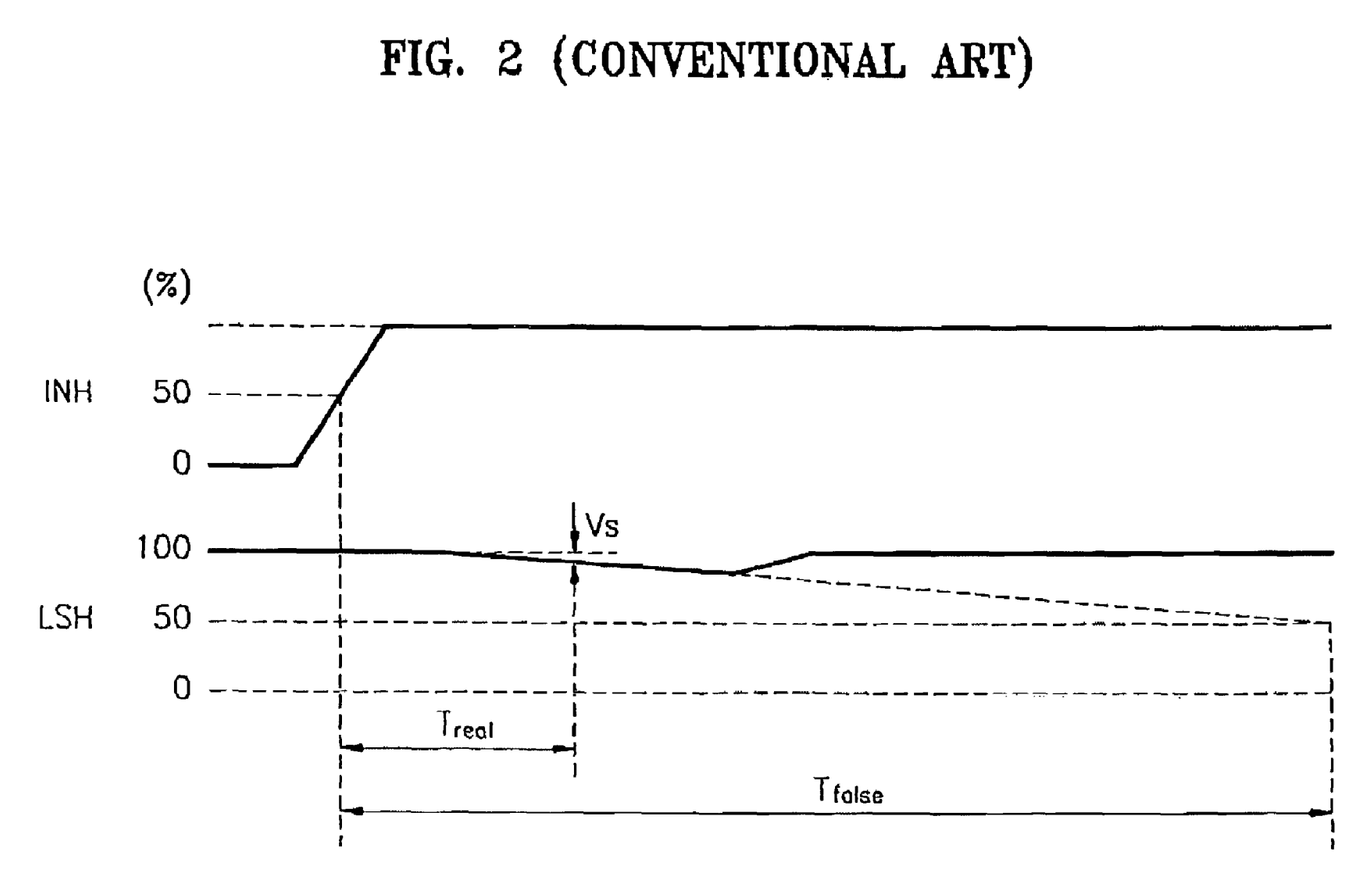
FIG. 2 is a waveform for explaining the background relationship between timings of input and/or output signals in the low voltage swing bus of FIG. 1.

FIG. 1 is a block diagram illustrating a low voltage swing bus according to conventional art, and FIG. 2 illustrates a waveform for describing the timing of input or output signals in the low voltage swing bus of FIG. 1.

Referring to FIG. 1, two signal lines operate as a pair and transmit the logic signals LSH and LSL, which are inverted with respect to each other (hereinafter, a signal line LSH and a signal line LSL).

Referring to FIG. 2, signals are transmitted or received through the low voltage swing bus in the following manner. First, the signal lines LSH and LSL are precharged to the supply voltage VDD. Next, one of the two signal lines LSH and LSL enters a logic state opposite to that of the precharging voltage. In other words, referring to FIGS. 1 and 2, when an input signal INH is high and an input signal INL is low, only the signal line LSH enters a logic low state and the signal line LSL maintains a logic high level. At that moment, the signal line LSH does not experience the full supply voltage VDD swing. When the voltage difference between the signal line LSH and the signal line LSL reaches Vs, a sense amplifying flip-flop, senses and amplifies the voltage difference Vs and outputs an active signal QH and an inverted signal QL of the active signal QH.

In such a low voltage swing bus, the delay between the signal to be transmitted to and the signal output from a sense amplifying flip flop (hereinafter, a sense amplifying flip flop) relates to the time necessary for the signal line LSH to reach the minimum voltage difference Vs that can be sensed by the sense amplifying flip flop, i.e., corresponds to $T_{real}$ of FIG. 2. However, during timing analysis of the low voltage swing bus, when using the STA tool, the delay between the signal transmitted to and the signal output from the sense amplifying flip flop is equal to the delay between signals that experience 50% of the full supply voltage VDD swing, according to a general delay model for the sense amplifying flip flop. As a result, incorrect delays are reported to the user.

In order to solve such a problem, delays between nodes, which are included in the low voltage swing bus, and the sense amplifying flip flop are obtained as a result of SPICE (Simulation Program with Integrated Circuit Emphasis, hereinafter SPICE), and stored in the database of the STA tool. Hence, the STA tool can refer to the results of SPICE simulation using a command file. However, timing analysis that includes modelling of the low voltage swing bus and sense amplifying flip flop, execution of SPICE simulation, and application of the STA tool is complex, inconvenient, and causes considerable loss of time.

SUMMARY OF THE EXEMPLARY EMBODIMENTS OF THE INVENTION

Exemplary embodiments of the present invention provide a low voltage swing bus analysis method used in an STA tool, which provides simple and accurate timing analysis verification, using a sense amplifying flip flop with a modelled set-up time, when the STA tool analyzes a semiconductor circuit or a logic circuit having a low voltage swing bus.

In another exemplary embodiment of the present invention, the STA tool receives the design file and executes the timing verification program. The STA tool extracts the timing model for each cell present in the design file during execution of the timing verification program from the database and calculates the timing for each node. The STA tool extracts a timing model for a sense amplifying flip flop, from execution of a subroutine and calculates the timing for each node connected to the sense amplifying flip flop. The STA tool completes the calculation of timings for nodes present in file then outputs the calculated timings.

In yet another exemplary embodiment of the present invention, the subroutine may include calculating a delay between a clock signal that may control output generation of the sense amplifying flip flop and an output signal. A first delay is obtained by adding m % as measured in picoseconds for example, to the calculated delay. Then the voltage difference is set between input signals of the sense amplifying flip flop. Next, a delay is calculated between the clock signal and the output signal according to the timing model for the sense amplifying flip flop. A second delay is obtained by adding m % as measured in picoseconds to the calculated delay between the clock signal and the output signal for when the input signals of the sense amplifying flip flop are input prior to input of the clock signal. The delay may range from 0% to 100% of the calculated delay. A delay between the clock signal and one activated input signal of the sense amplifying flip flop is determined. Next, one activated input signal and other signal at a precharging voltage level for sense amplifying flip flop is received. A timing model that has the delay between the clock signal and one activated input signal is determined.

BRIEF DESCRIPTION OF THE DRAWINGS

The above and other aspects and exemplary embodiments of the present invention will become more apparent by describing in detail an exemplary embodiments thereof with reference to the attached drawings in which.

DETAILED DESCRIPTION OF THE INVENTION

Exemplary embodiments of the present invention will now be described more fully with reference to the accompanying drawings, in which exemplary embodiments of the invention are shown. In the drawings, the forms of elements are exaggerated for clarity. To facilitate understanding, identical reference numerals have been used, where possible, to designate identical elements that are common in the figures.

Figure 3:
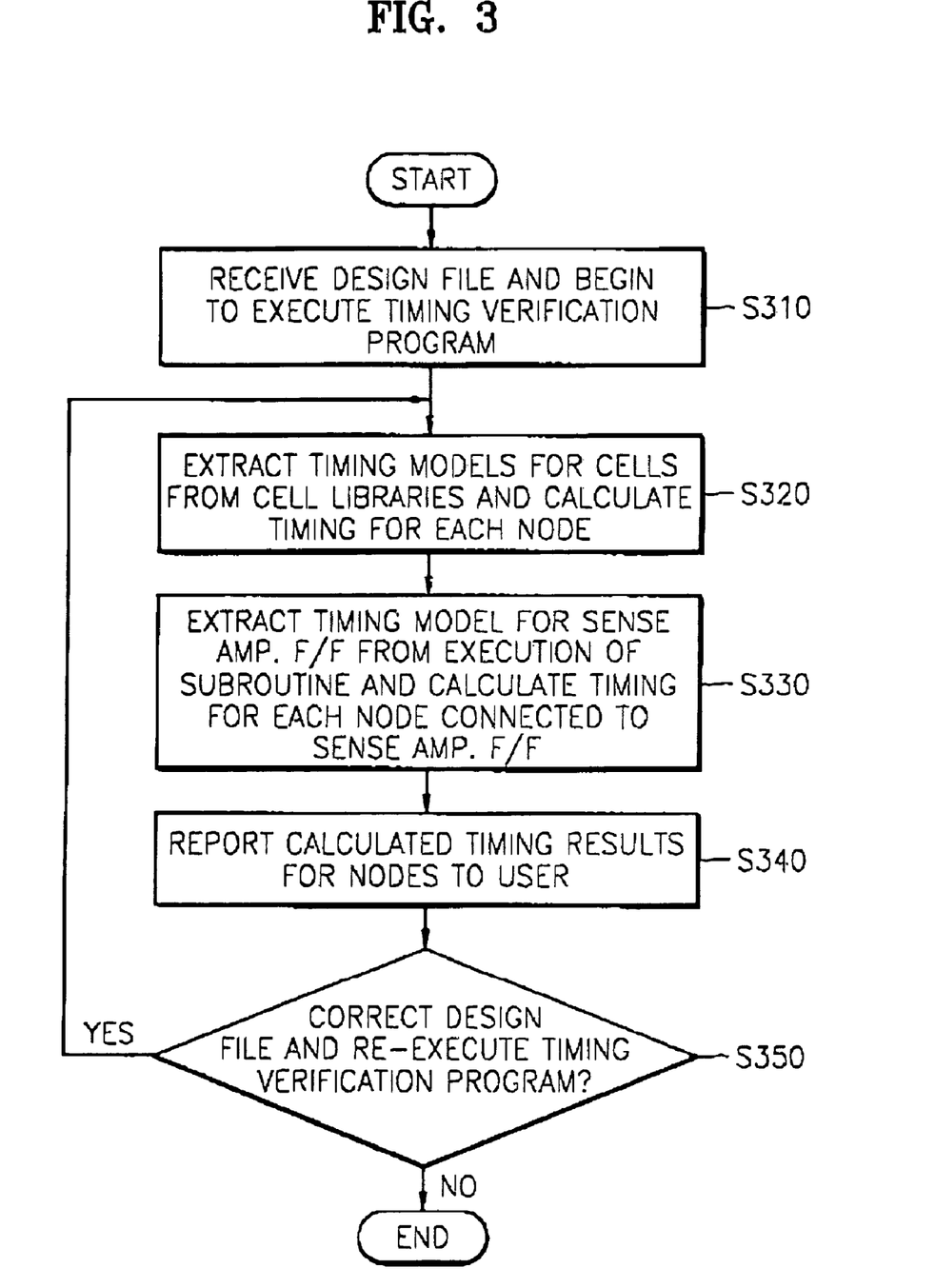
FIG. 3 is a flowchart for describing a low voltage swing bus analysis method used in a static timing analysis (STA) tool according to an exemplary embodiment of the present invention.

FIG. 3 is a flowchart for describing a low voltage swing bus analysis method used in a STA tool according to an exemplary embodiment of the present invention.

Referring to FIG. 3, the STA tool includes a database and a timing verification program as non-limiting examples. The database, optionally stores cell libraries with the timing models of respective cells. The timing verification program interprets a design file that is designed based on the cell libraries. Such an STA tool performs low voltage swing bus analysis as follows.

First, a user inputs the design file to the STA tool and then issues a command for execution of the timing verification program. Next, the STA tool receives the input design file and begins to execute the timing verification program (step S310).

In other words, the STA tool interprets the design file that is designed based on the cell libraries optionally stored in a database, by executing the timing verification program. The user creates the design file based on the cell libraries by designating critical timing parts of a semiconductor or logic circuit. The cell libraries include various cells including the following non-limiting examples, such as, gate level cells PMOSFET, NMOSFET, and bipolar junction transistors (BJT); unit logic level cells INVERTER AND, and/or OR; or cells with special functions, e.g., a sense amplifying flip flop, in which it is difficult to calculate delays between the input and the output. The cell libraries also include those cells required for the design process, such as a delay line or a transmission path as further non-limiting examples.

The STA tool extracts from the cell libraries the timing model for each cell present in the design file during execution of the timing verification program and estimates the timing of each node (step S320). At this time, a node denotes a connection point between cells.

In particular, the STA tool extracts from the execution of the subroutine the timing model for a sense amplifying flip flop, among the cells present in the design file during execution of the timing verification program and estimates the timing for each node connected to the sense amplifying flip flop (step S330). After completion of the timing estimations for nodes of cells present in the design file, the STA tool reports the calculated timings for nodes to the user (step S340). The user checks the report, reviews the design file, corrects the design files requiring correction, and then re-executes the timing verification program (step S350).

Figure 4:
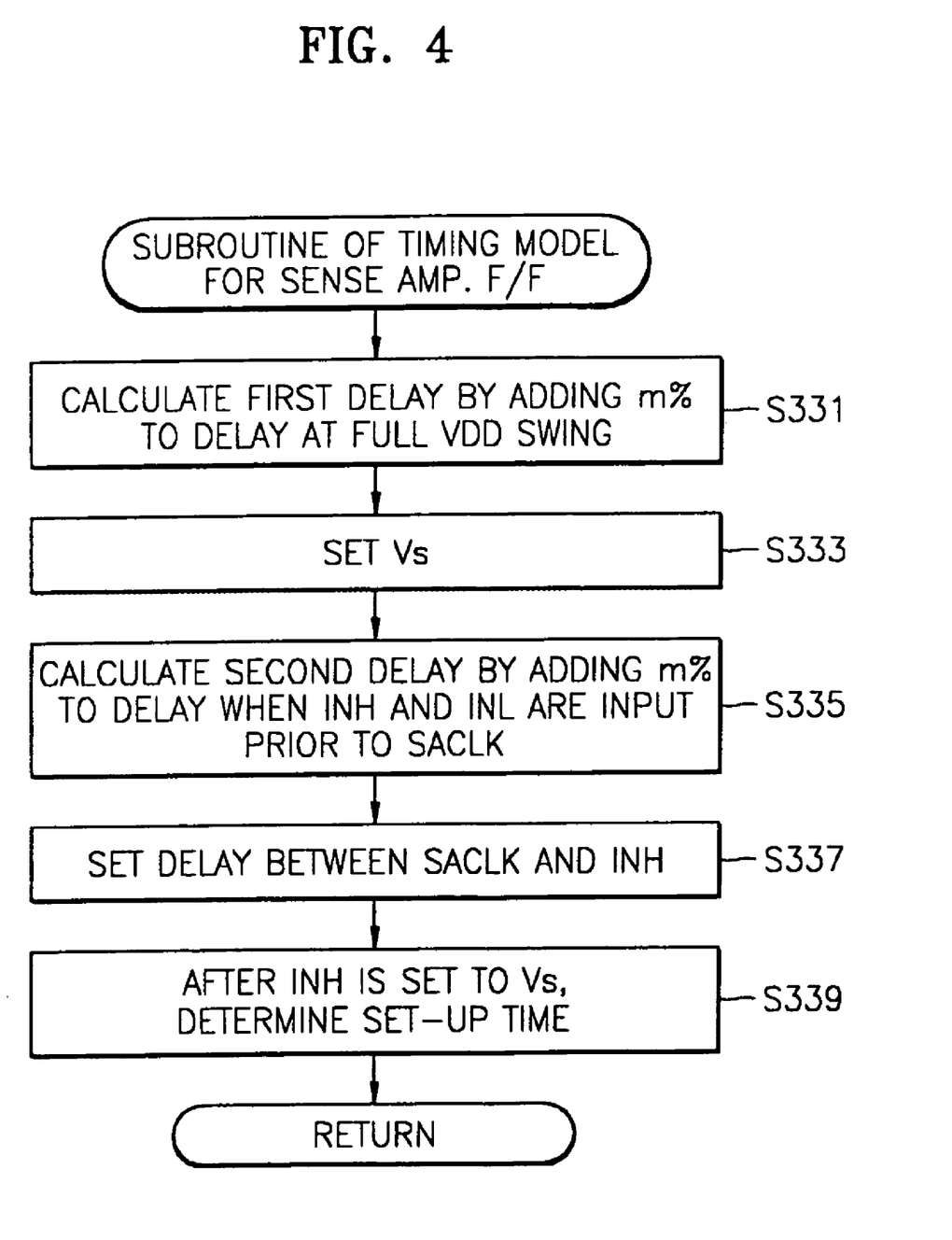
FIG. 4 is a flowchart for describing a subroutine of a timing model for a sense amplifying flip flop according to another exemplary embodiment of the present invention.

FIG. 4 is a flowchart for describing a subroutine of a timing model for the sense amplifying flip flop.

Referring to the subroutine described in FIG. 4, the STA tool calculates a delay between an output signal QH or QL and a clock signal SACLK, which controls the output generation of the sense amplifying flip flop for the output load of the sense amplifying flip flop. This calculation is based on the timing model for the sense amplifying flip flop optionally stored in the database and occurs when the voltage difference between input signals INH and INL of the sense amplifying flip flop is equal to the supply voltage VDD, i.e., experiences the full supply voltage VDD swing (step S331).

The sense amplifying flip flop senses a low voltage swing in which either the input signal INH or the input signal INL is activated as shown in FIG. 1. Then the sense amplifying flip flop generates the output signal OH or OL when the clock signal SACLK is activated. The sense amplifying flip flop is required for STA of the low voltage swing. However, according to the conventional art, low-voltage swing nodes are dispersed over the semiconductor circuit or logic circuit and the sense amplifying flip flop must refer to the results of SPICE simulation. This process is inconvenient and time-consuming.

Hence, in an exemplary embodiments in the present invention, the subroutine of the timing model for the sense amplifying flip flop is automatically executed during execution of the timing verification program, which allows for application of the timing model for the sense amplifying flip flop.

After the delay between the clock signal SACLK and the output signal QH or QL has been calculated, in the subroutine, the sense amplifying flip flop calculates a first delay by adding m % that is Vs set information to the delay with the voltage difference at a full-supply voltage VDD swing (step S331). The "m" is a variable that may vary with the subroutine. Thus, in the subroutine, the voltage difference between the input signals INH and INL of the sense amplifying flip flop is set to Vs based on the timing model for the sense amplifying flip flop (step S333).

Figure 5:
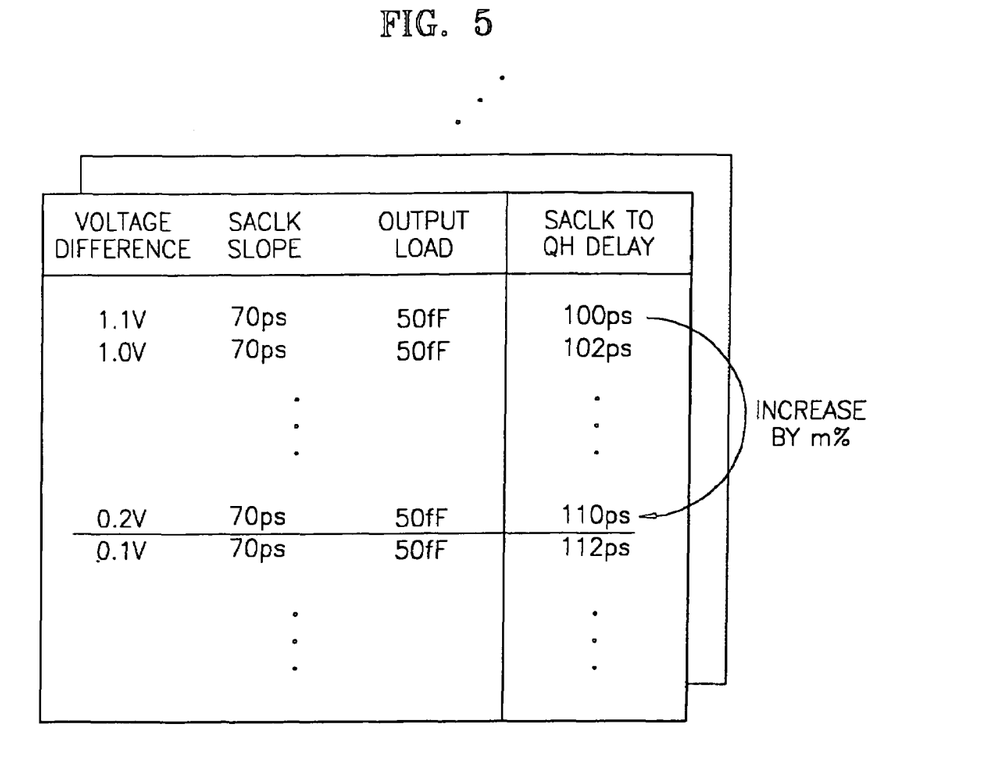
FIG. 5 illustrates a timing model file showing the relationship of a voltage difference between input voltages INH and INL of the sense amplifying flip flop and a delay between a clock signal SACLK and an output signal QH according to an exemplary embodiment of the present invention.
Figure 6:
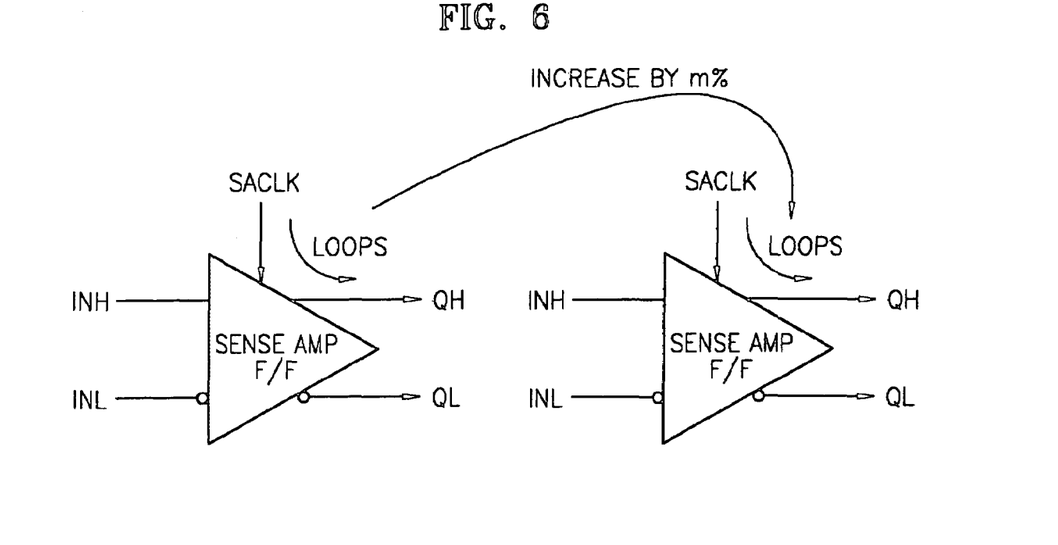
FIG. 6 illustrates a timing model according to an exemplary embodiment of the present invention showing the relationship of a clock signal SACLK and the output signal OH in the sense amplifying flip flop according to the timing model file of FIG. 5.

FIG. 5 illustrates a timing model file according to an exemplary embodiment of the present invention showing the relationship of a voltage difference between input voltages INH and INL of the sense amplifying flip flop and a delay between a clock signal SACLK and an output signal QH. FIG. 6 illustrates a timing model according to another exemplary embodiment of the present invention showing the relationship between the clock signal SACLK and the output signal OH in the sense amplifying flip flop, according to the timing model file of FIG. 5.

Referring to FIGS. 5 and 6, the timing model files for the sense amplifying flip flop include the delay between the clock signal SACLK and the output signal QH for the output load of the sense amplifying flip flop, the transition slope of the clock signal SACLK, and the voltage difference between the input signals INH and INL of the sense amplifying flip flop, with the output load.

As shown in FIGS. 5 and 6, "m" is assumed to be 10% in one non-limiting example. The delay between the clock signal SACLK and the output signal QH lasts until the output signal QH is output, when the input signal INH is activated, after the clock signal SACLK is input to the sense amplifying flip flop. If the input signal INL is activated, the delay between the clock signal SACLK and the output signal QH lasts until the output signal QL is output.

The input signals INH and INL are controlled by a conventional logic circuit and precharged to the supply voltage VDD before being activated, thereby the signals are maintained at the supply voltage level. Thus, the activated input signal INH or INL enters a logic high or logic low state from the precharging voltage level.

After the voltage difference between the input signals INH and INL has been set to Vs in the subroutine, the delay between the clock signal SACLK and the output signal QH or QL is calculated according to the timing model for the sense amplifying flip flop. The calculation is for the output load of the sense amplifying flip flop and the transition slope of the activated input signal INH and for when the inputs signals INH and INL of the sense amplifying flip flop are input prior to input of the clock signal SACLK. In addition, a second delay is obtained by adding m % to the calculated delay (step S335) as shown in FIG. 4. Thus, according to the timing model for the sense amplifying flip flop, the delay between the clock signal SACLK and the activated input signal INH, i.e., SACLK-INH, is set (step S337).

Figure 7:
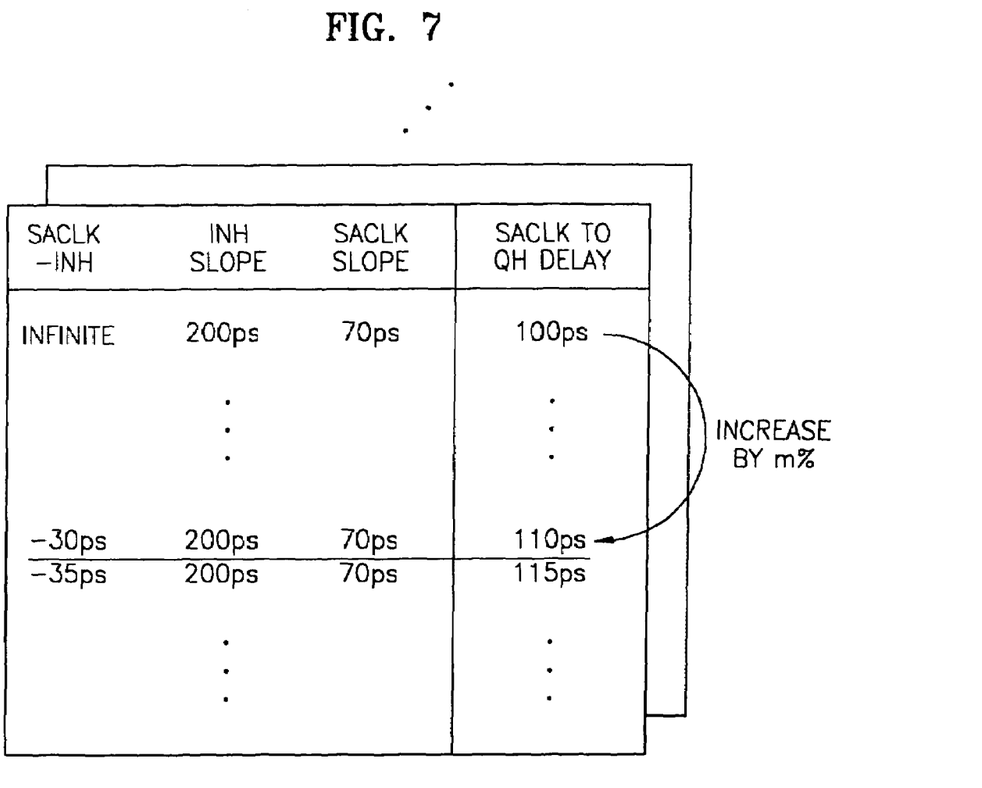
FIG. 7 illustrates a timing model according to yet another exemplary embodiment of the present invention file showing the relationship between the delay between the input signal INH and the clock signal SACLK and a delay between the clock signal SACLK and the output signal QH in the sense amplifying flip flop.
Figure 8:
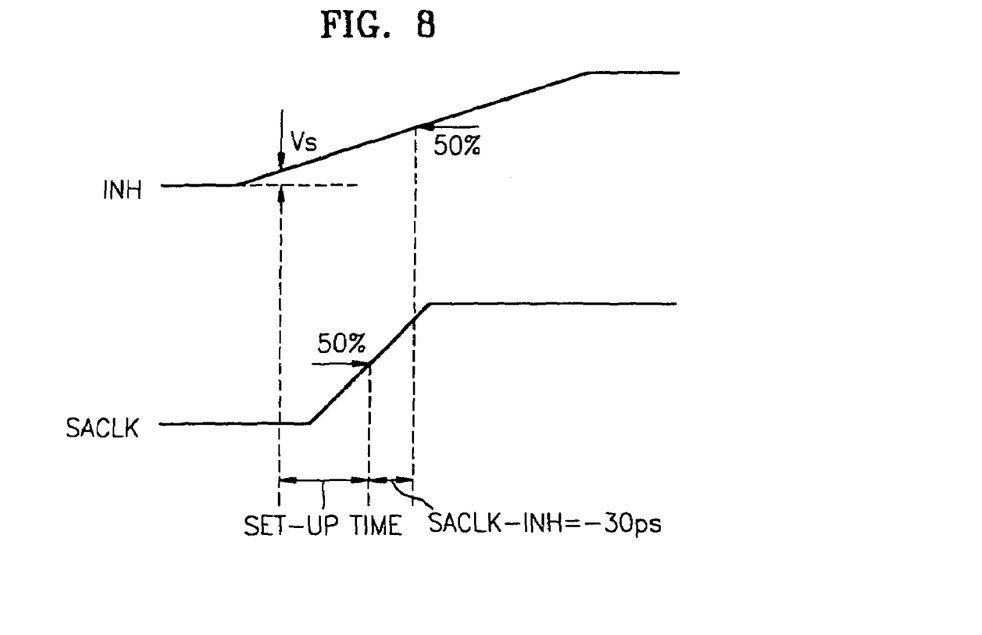
FIG. 8 illustrates a graph according to an exemplary embodiment of the present invention for describing a set-up time of the sense amplifying flip flop according to the timing model file of FIG. 7.

FIG. 7 illustrates a timing model file showing the relationship of a delay between the input signal INH and the clock signal SACLK and a delay between the clock signal SACLK and the output signal QH in the sense amplifying flip flop. FIG. 8 illustrates a graph for describing a set-up time of the sense amplifying flip flop according to the timing model file of FIG. 7.

Referring to FIGS. 7 and 8, according to the timing model files of sense amplifying flip flop, the output load, the transition slope of the activated input signal INH, and the delay between the clock signal SACLK and the activated input signal INH, i.e., SACLK-INH, correspond to the delay between the clock signal SACLK and the output signal QH or OL, respectively. The output load is not shown in FIG. 7, but corresponds to that of FIG. 5. As shown in FIG. 8, the delay SACLK-INH is equal to the difference between the time point at which the clock signal SACLK experiences 50% of the full supply voltage VDD swing and the time point at which the activated input signal INH experiences 50% of the full supply voltage VDD swing.

As shown in FIG. 7, m is assumed to be 10% in one non-limiting example. When the input signals INH and INL of sense amplifying flip flop are input prior to input of the clock signal SACLK, the delay between the clock signal SACLK and the activated input signal INH, i.e., SACLK-INH corresponds to "INFINITE" as shown in FIG. 7. This "INFINITE" heading indicates that the input signals INH and INL have already experienced the full supply voltage VDD swing before the clock signal SACLK is activated.

As described above, once the delay SACLK-INH is obtained, in the subroutine and after the activated input signal INH is set to Vs, as shown in FIG. 8, the timing model for the sense amplifying flip flop, which receives the activated input signal INH and other signal at the precharging voltage level, includes the delay SACLK-INH. In other words, the set-up time lasts from the time point at which the input signal INH is set to Vs to the time point at which the clock signal SACLK experiences 50% of the full supply voltage VDD swing. Hence, the sense amplifying flip flop is optionally, modeled to receive the clock signal SACLK experiencing 50% of the full supply voltage VDD swing, from the time point at which the activated input signal INH is set to Vs to the time point at which the clock signal SACLK exhibits the delay SACLK-INH.

According to the low voltage swing bus analysis method, which uses an STA tool that includes a database for storing cell libraries of cells and a timing verification program for analyzing a design file based on the cell libraries, a timing model for sense amplifying flip flop, which is presented in the design file during execution of a timing verification program, is extracted from execution of a subroutine, thereby calculating the timing for each node connected to the sense amplifying flip flop.

In other words, in the subroutine, the delay between the output signal QH or QL and the clock signal SACLK that controls output generation of the sense amplifying flip flop is calculated according to the timing model for the sense amplifying flip flop, which is optionally stored in a database. This calculation is for the output load of sense amplifying flip flop and occurs when the voltage difference between the input signals INH and INL of sense amplifying flip flop corresponds to the supply voltage, i.e., experiences the full supply voltage VDD swing. The first delay is calculated by adding m % that is Vs set information, to the delay at full supply VDD swing. Thus, the voltage difference between input signals INH and INL, corresponding to the first delay, is set to Vs.

In addition, the delay between the clock signal SACLK and the output signal QH or QL is calculated according to the timing model of the sense amplifying flip flop for the output load of the sense amplifying flip flop and the transition slope of the activated input signal INH. This calculation occurs when the inputs signals INH and INL of the sense amplifying flip flop are input prior to input of the clock signal SACLK. In addition, the second delay is obtained by adding m % to the calculated delay. Thus, the delay between the clock signal SACLK and the activated input signal INH is determined according to the timing model for the sense amplifying flip flop.

After the input signal INH is set to Vs, the timing model for the sense amplifying flip flop, which receives the activated input signal INH and other signal, at the precharging voltage level, includes the delay SACLK-INH.

As described above, the low voltage swing bus analysis method of the STA tool according to exemplary embodiments of to the present invention provides accurate and simple timing analysis verification, by modeling the sense amplifying flip flop with a set-up time, when the STA tool analyzes the semiconductor circuit or logic circuit with the low voltage swing bus.

While the exemplary embodiments of the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A low voltage swing bus analysis method used in a static timing analysis (STA) tool, the low voltage swing bus analysis method comprising:
   receiving a file and executing a design timing verification program using the STA tool;
   extracting a timing model for each cell present in the file during execution of the timing verification program using the STA tool, and calculating a timing for each node;
   extracting a timing model for a sense amplifying flip flop, among cells present in the file during execution of the timing verification program, by executing of a subroutine and calculating a timing for each node connected to the sense amplifying flip flop using the STA tool; and
   outputting the calculated timings after completing calculation of timings for nodes present in the design file using the STA tool.

2. The low voltage swing bus analysis method of claim 1, wherein the subroutine comprises:
   obtaining a calculated delay between a clock signal and an output signal according to a timing model for the sense amplifying flip flop when a voltage difference between input signals of the sense amplifying flip flop is equal to a supply voltage;
   obtaining a first delay by adding m %, to the calculated delay;
   setting the voltage difference between input signals of the sense amplifying flip flop which corresponds to the first delay;
   calculating a delay between the clock signal and the output signal according to the timing model for the sense amplifying flip flop;
   obtaining a second delay by adding m % to the calculated delay between the clock signal and the output signal when the input signals of the sense amplifying flip flop are input prior to input of the clock signal;
   determining a delay between the clock signal and one activated input signal of the sense amplifying flip flop, which corresponds to the second delay, according to the timing model for the sense amplifying flip flop; and
   receiving one activated input signal and other signal at a precharging voltage level for sense amplifying flip flop, and determining a timing model that has the delay between the clock signal and one activated input signal.

3. The low voltage swing bus analysis method of claim 2, wherein m can be set depending on the subroutine.

4. The low voltage swing bus analysis method of claim 2, wherein the timing model for the sense amplifying flip flop includes the delay between the clock signal and the output signal for the output load of the sense amplifying flip flop, a transition slope of the clock signal, and the voltage difference between input signals of the sense amplifying flip flop; and the delay between the clock signal and the output signal for the output load of the sense amplifying flip flop, the transition slope of the activated input signal of the sense amplifying flip flop, and the delay between the clock signal and one activated input signal of the sense amplifying flip flop.

5. The low voltage swing bus analysis method of claim 2, wherein the delay between the clock signal and one activated input signal of the sense amplifying flip flop is equal to a difference between a time point at which the clock signal experiences substantially 50% of a full supply voltage swing and a time point at which the activated input signal experiences 50% of the full supply voltage swing.

6. The low voltage swing bus analysis method of claim 2, wherein the sense amplifying flip flop has a set-up time that lasts from a time point at which one activated input signal is set to Vs to the time point at which the clock signal experiences substantially 50% of the full supply voltage swing.

7. The low voltage swing bus analysis method of claim 4, wherein the delay between the clock signal and one activated input signal of the sense amplifying flip flop is equal to a difference between a time point at which the clock signal experiences substantially 50% of a full supply voltage swing and a time point at which the activated input signal experiences substantially 50% of the full supply voltage swing.

8. A low voltage swing bus analysis method used in a static timing analysis (STA) tool, the low voltage swing bus analysis method comprising:
   receiving a design file and executing a timing verification program;
   extracting the timing model for each cell, present in a design file during execution of the timing verification program, from the database and calculating a timing for each node;
   extracting a timing model for a sense amplifying flip flop, among cells present in the design file during execution of the timing verification program, from execution of a subroutine and calculating a timing for each node connected to the sense amplifying flip flop; and
   outputting the calculated timings after completing calculation of timings for nodes present in the file.

9. A low voltage swing bus subroutine method comprising:
   calculating a delay between a clock signal and an output signal model for a sense amplifying flip flop, when a voltage difference between input signals of the sense amplifying flip flop is equal to a supply voltage;
   obtaining a first delay by adding m %, to the calculated delay;
   setting the voltage difference between input signals of the sense amplifying flip flop, which correspond to the first delay;
   obtaining a second delay by adding m % to the calculated delay between the clock signal and the output signal for when the input signals of the sense amplifying flip flop are input prior to input of the clock signal;
   receiving one activated input signal and other signal at a precharging voltage level for sense amplifying flip flop, and determining a timing model that has the delay between the clock signal and one activated input signal.

10. The low voltage swing bus analysis method of claim 9, wherein m can be set depending on the subroutine.

11. The low voltage swing bus analysis method of claim 9, wherein the timing model for the sense amplifying flip flop includes the delay between the clock signal and the output signal for the output load of the sense amplifying flip flop, a transition slope of the clock signal, and the voltage difference between input signals of the sense amplifying flip flop; and the delay between the clock signal and the output signal for the output load of the sense amplifying flip flop, the transition slope of the activated input signal of the sense amplifying flip flop, and the delay between the clock signal and one activated input signal of the sense amplifying flip flop.

12. The low voltage swing bus analysis method of claim 9, wherein the delay between the clock signal and one activated input signal of the sense amplifying flip flop is equal to a difference between a time point at which the clock signal experiences approximately 50% of a full supply voltage swing and a time point at which the activated input signal experiences 50% of the full supply voltage swing.

13. The low voltage swing bus analysis method of claim 9, wherein the sense amplifying flip flop has a set-up time that lasts from a time point at which one activated input signal is set to Vs to the time point at which the clock signal experiences approximately 50% of the full supply voltage swing.

14. The low voltage swing bus analysis method of claim 11, wherein the delay between the clock signal and one activated input signal of the sense amplifying flip flop is equal to a difference between a time point at which the clock signal experiences approximately 50% of a full supply voltage swing and a time point at which the activated input signal experiences approximately 50% of the full supply voltage swing.

15. A low voltage swing bus analysis subroutine method comprising:

determining a delay between a clock signal and an output signal according to a timing model for a sense amplifying flip flop, when a voltage difference between input signals of the sense amplifying flip flop is equal to a supply voltage;

determining a first delay by adding m %, to the calculated delay;

setting the voltage difference between input signals of the sense amplifying flip flop, which correspond to the first delay;

obtaining a second delay by adding m % to the calculated delay between the clock signal and the output signal for when the input signals of the sense amplifying flip flop are input prior to input of the clock signal;

receiving one activated input signal and other signal at a precharging voltage level for sense amplifying flip flop, and determining a timing model that has the delay between the clock signal and one activated input signal.

16. The low voltage swing bus analysis method of claim 15, wherein between obtaining a first and second delay the method further comprises:

calculating a delay between the clock signal and the output signal according to a timing model for the sense amplifying flip flop, for the output load of the sense amplifying flip flop and a transition slope of an activated input signal among input signals of the sense amplifying flip flop when the input signals of the sense amplifying flip flop core input prior to input of the clock signal.

* * * * *